(12) United States Patent
Solak et al.

(10) Patent No.: US 8,368,871 B2
(45) Date of Patent: Feb. 5, 2013

(54) LITHOGRAPHIC FABRICATION OF GENERAL PERIODIC STRUCTURES

(75) Inventors: Harun H. Solak, Brugg (CH); Christian Dais, Turgi (CH); Francis Clube, Neuchatel (CH)

(73) Assignee: Eulitha AG, Villigen (CH)

( * ) Notice: Subject to any disclaimer, the term of this patent is extended or adjusted under 35 U.S.C. 154(b) by 358 days.

(21) Appl. No.: 12/706,081

(22) Filed: Feb. 16, 2010

(65) Prior Publication Data
US 2011/0199598 A1 Aug. 18, 2011

(51) Int. Cl.
*G03B 27/52* (2006.01)
(52) U.S. Cl. ............................................. 355/77; 355/53
(58) Field of Classification Search ..................... 355/50, 355/53, 67, 77
See application file for complete search history.

(56) References Cited

U.S. PATENT DOCUMENTS

| 4,360,586 A | 11/1982 | Flanders et al. | |
|---|---|---|---|
| 2006/0286488 A1* | 12/2006 | Rogers et al. | 430/325 |
| 2011/0199598 A1* | 8/2011 | Solak et al. | 355/67 |
| 2011/0310374 A1* | 12/2011 | Solak et al. | 355/67 |
| 2012/0092634 A1* | 4/2012 | Solak et al. | 355/67 |
| 2012/0092635 A1* | 4/2012 | Solak et al. | 355/67 |

FOREIGN PATENT DOCUMENTS
EP 05803386.1 4/2006

OTHER PUBLICATIONS

Zanke et al., "Large area patterning for photonic crystals via coherent diffraction lithography", J. Vac. Sci. Technol. B 22 (2004), pp. 3352-3355.
Solak et al., "Achromatic Spatial Frequency Multiplication: A Method for Production of Nanometer-Scale Periodic Structures", J. Vac. Sci. Technol., 23 (2005), pp. 2705-2710.
Tennant et al.,"Characterization of near-field holography gratings masks for optoelectronics fabricated by electron beam lithography", J. Vac. Sci Technol. B (1992), pp. 2530-2535.

* cited by examiner

*Primary Examiner* — Thomas R Artman
(74) *Attorney, Agent, or Firm* — Laurence A. Greenberg; Werner H. Stemer; Ralph E. Locher

(57) ABSTRACT

A lithographic method related to Talbot imaging for printing a desired pattern of features that is periodic or quasi-periodic in at least one direction onto a substrate surface, which method includes providing a mask bearing a pattern of mask features, arranging the substrate parallel and in proximity to the mask, providing an illumination source having a central wavelength and a spectral bandwidth, forming from said source an illumination beam with an angular distribution of intensity, arranging the distance of the substrate from the mask and exposing the mask pattern to said beam so that each angular component of illumination exposes the substrate to substantially the entire range of lateral intensity distributions that occur between successive Talbot image planes for the illumination wavelengths, wherein the angular distribution of the beam is designed in conjunction with the pattern of features in the mask and the distance of the substrate from the mask.

17 Claims, 13 Drawing Sheets

LITHOGRAPHIC FABRICATION OF GENERAL PERIODIC STRUCTURES

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION BY REFERENCE OF MATERIAL SUBMITTED ON A COMPACT DISC

Not Applicable

BACKGROUND TO THE INVENTION

1. Field of the Invention

This invention generally relates to the field of photolithography as employed for the fabrication of micro- and nano-structures, and it relates more particularly to the field of Talbot imaging as employed for transferring periodic patterns of features defined in a mask onto a photosensitive layer on a substrate.

2. Description of Related Art

Lithographic fabrication enables the creation of micro- and nano-patterns on surfaces. Photolithographic techniques involve exposure of a photosensitive surface to a light-field with a certain pattern of intensity distribution. The surface usually consists of a thin layer of sensitive film, such as a photoresist, coated onto a substrate surface. Chemical or physical changes that occur in the photoresist may be used in subsequent processes to obtain desired patterns of materials on the substrate surface. In the most commonly used photolithographic technique the pattern is defined in a mask and the pattern is transferred to the substrate by illuminating the mask and imaging the light transmitted by the pattern onto the substrate surface using an optical system.

For many applications patterns are required that comprise a unit cell of pattern features that repeat in one or two dimensions, that is, periodic patterns. A specialized photolithographic technique based on the Talbot effect is advantageous for transferring such periodic patterns from masks onto substrates because it avoids the use of an imaging system which, for high resolution patterns, is complex and high-cost. With this technique a mask defining a periodic pattern is illuminated with collimated beam of monochromatic light and the light diffracted by the pattern reconstructs images of the periodic pattern at certain distances, called Talbot planes, from the mask (see, for example, C. Zanke, et al., "Large area patterning for photonic crystals via coherent diffraction lithography", J. Vac. Sci. Technol. B 22, 3352 (2004)). In the case of a one-dimensional periodic patterns, in which a unit cell of features repeats in one direction, the separation, s, between successive Talbot planes is related to the illumination wavelength, $\lambda$, and period of the pattern, p, by $$s \approx 2p^2/\lambda \qquad \text{equ. (1)}$$

For two-dimensional patterns, the constant in the above expression is generally not 2 but depends on the periods of the pattern in the two directions and on the composition of the unit cell. For a hexagonal close packed pattern of features, however, the factor 2 still applies if the parameter p refers to the period in the direction of the nearest neighbor.

The Talbot effect, which is also called self-imaging, may be used to print periodic patterns onto substrates. Midway between the Talbot planes there are other images with the same period that are phase shifted by half the period with respect to those in the Talbot planes. Furthermore, between these phase-shifted images and the self-images there are so-called Talbot sub-images that have higher spatial frequencies. By placing a photoresist coated substrate at one of these fractional Talbot planes, periodic patterns can be printed with a spatial frequency that is a multiple of that in the original mask. This variant, which enables spatial-frequency multiplication, performs better when the duty cycle of the periodic pattern in the mask is optimized to yield a high-contrast intensity distribution in the fractional Talbot planes (see U.S. Pat. No. 4,360,586). In the prior art, it is also known that by fabricating the periodic patterns in the mask out of phase shifting materials the contrast of the Talbot images can be enhanced. With the Talbot technique, however, the intensity distribution of the imaged pattern is very sensitive to the distance from the mask. Therefore, precise positioning and alignment of the substrate to be patterned with respect to the mask is of critical importance. This "depth of field" (DoF) consideration becomes much more restrictive as the period of the pattern in the mask is reduced because the DoF depends on the square of the pattern period. This limitation is especially severe if the periodic patterns need to be printed onto substrates that have imperfect flatness or have topographical features on their surface.

In another, related method known in the prior art as "near field holography", a mask with a periodic pattern is illuminated obliquely by a collimated beam of monochromatic light (see, for example, D. M. Tennant, et al., "Characterization of near-field holography grating masks for opto-electronics fabricated by electron beam lithography, J. Vac. Sci. Technol. B 10, 2530 (1992)). The angle of incidence of the illuminating beam is chosen in relation to the period of the pattern and to the wavelength of the light so that only the zeroth-order (i.e. undiffracted) beam and a first-order diffracted beam are present in the transmitted light-field. An image of the periodic pattern is formed by the interference of these two transmitted beams. A major drawback of this method is that the pattern transferred to the substrate necessarily has the same period as the pattern in the mask, in other words there can be no gain in resolution with respect to the mask. Furthermore, only one-dimensional, line/space periodic patterns can be transferred with this method, which is a considerable disadvantage. Additionally, in order that the imaged pattern has a good contrast this method requires the use of expensive phase masks that are usually formed by etching the patterns into fused silica substrates. Moreover, this method requires obliquely incident light which results in a rather cumbersome system configuration, and requires polarized light which can further complicate the illumination system and reduce the utilization efficiency of the light source.

Achromatic Talbot lithography has recently been introduced as a new method for printing high-resolution periodic patterns in a cost effective way (see H. H. Solak, et al., "Achromatic Spatial Frequency Multiplication: A Method for Production of Nanometer-Scale Periodic Structures", J. Vac. Sci. Technol., 23, 2705 (2005) and European Patent Application No. 05803386.1). It offers two significant advantages for lithographic applications: firstly, it overcomes the depth-of-field problem encountered in the classical Talbot method described above, and secondly, for many pattern types the printed patterns have a higher spatial-frequency than that in the mask, that is, it can perform a spatial-frequency multiplication. Achromatic Talbot lithography (ATL) illuminates the mask with a collimated beam from a broadband source and the substrate to be patterned is placed at or beyond a certain distance from the mask at which the image generated becomes stationary, that is, invariant to further increase in distance. The minimum distance, $d_{min}$, required for the stationary image to be formed is related to the period of the pattern, p, in the mask and to the spectral bandwidth of the illumination, $\Delta\lambda$, by:

$$d_{min} \approx 2p^2/\Delta\lambda \qquad \text{equ. (2)}$$

At this distance the Talbot planes for the different wavelengths are distributed in a continuous manner, and so placing the substrate at or beyond this distance exposes the substrate to the entire range of lateral intensity distributions that occur between successive Talbot planes for the individual exposure wavelengths. The pattern printed onto the substrate is therefore the integration, or average, of this range of distributions, and this is insensitive to increasing distance between the substrate and mask. This property of a stationary image is also entirely different to the behavior of the images of mask patterns produced by conventional projection, proximity or contact lithography techniques, for all of which the images show a strong variation in the direction of image propagation, thus restricting their range of application.

If ATL is applied to one-dimensional patterns of the line/space type, the stationary image printed onto the substrate usually exhibits spatial-frequency multiplication: the period of the pattern is generally reduced by a factor of two. In the case of two-dimensional patterns, the spatial-frequency of the printed pattern depends on the arrangement of the features in the mask. For example, if the mask has an array of clear holes on a square grid the ATL image generally consists of intensity peaks on a square grid with a period that is smaller than that in the mask by a factor of $\sqrt{2}$. On the other hand, when the mask has an array of holes on a hexagonal grid the ATL image generally consists of intensity peaks on a hexagonal grid with the same period. The intensity distribution in the ATL image produced by a particular mask pattern may be determined using modeling software that simulates the propagation of electromagnetic waves through masks and through space. Such simulation tools may therefore be used to optimize the design of the pattern in the mask for obtaining a particular printed pattern at the substrate surface.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the stationary image are generated by a part of the mask in which the period is substantially constant. The tolerance to such variation in period may be determined using modeling software of the kind mentioned above, and the patterns concerned may be characterized as being quasi-periodic.

A drawback of ATL is that it requires a relatively large separation between the mask and substrate, and so the spatial coherence and collimation of the illumination beam need to be much higher. For certain light sources, such as arc lamps, this is a problem because higher spatial coherence and collimation can only be achieved by greater spatial filtering, and this reduces the power in the illumination beam, which is undesirable for a production process.

Increasing the separation between mask and substrate also degrades the edges of the printed pattern. This occurs, firstly, because of Fresnel diffraction effects at the edges of the light-field transmitted by the mask, which get stronger as the propagation distance increases; and, secondly, because the different diffracted orders in the transmitted light-field diverge as they propagate, and so at the edges of the light-field there is imperfect overlap between the orders and therefore imperfect image generation, which gets worse with increasing separation.

The advantages offered by the ATL technique may also be obtained using another prior art modification of the classical Talbot method. In this alternative scheme, the periodic pattern in the mask is illuminated by a collimated beam of substantially monochromatic light and during exposure the substrate is displaced longitudinally relative to the mask by at least a distance corresponding substantially to the separation between successive Talbot image planes. The technique, which may be called Displacement Talbot lithography (DTL), also results in the substrate being exposed to the entire range of lateral intensity distributions that occur between successive Talbot image planes, thereby also producing an integration, or averaging, of the intensity distributions concerned over the course of the exposure. Whereas the effects of the ATL and DTL techniques are essentially the same, in that they both produce stationary images and enable spatial-frequency multiplication, the DTL scheme also operates well with much smaller separations of the substrate and mask, so is advantageous in view of degradation at pattern edges and utilization efficiency of the light source. Further, the DTL technique is more suitable for printing high-resolution patterns over high topographies on the substrates; and it allows the use of laser source, which can be desirable for a production process.

The form of the patterns printed by DTL at the substrate surface using one-dimensional and two-dimensional patterns in the mask are essentially the same as for ATL and can be determined using similar modeling software as mentioned above.

As for ATL, DTL is not restricted to purely periodic patterns but can also be applied to quasi-periodic patterns.

In fact, the same averaging of the entire range of lateral intensity distributions between successive Talbot image planes may also be achieved using a combination of the ATL and DTL methodologies. For example, if a (non-monochromatic) source with a bandwidth, $\Delta\lambda$, is employed and the substrate is arranged at a distance $d<d_{min}$ (see equ. (2) for ATL), then the required averaging effect may still be achieved by additionally longitudinally displacing the substrate relative to the mask, the displacement needed being less than that required by just DTL. By arranging $d<d_{min}$, the undesirable consequences of a large separation between substrate and mask can be reduced.

Using the ATL or DTL techniques (or a combination of partial forms thereof), it can be difficult and/or expensive, however, to design and realize mask patterns that can generate the intensity distributions required at the substrate surface for certain applications. Furthermore, they are too restrictive for generating images with intensity profiles that have large enough gradients at the edges of the features and have sufficiently high contrast for ensuring a high-yield production process. It is, moreover, desirable for some applications that the shapes of the holes printed from a particular mask can be changed without changing the mask. It is further desirable that periodicities of feature can be printed from a particular mask that cannot be achieved using ATL or DTL.

It is therefore the purpose of the present invention to provide a solution to overcome the above-described limitations and disadvantages of achromatic Talbot lithography and displacement Talbot lithography as taught in the prior art. Specifically, it is a first object of the invention to provide a cost-effective and more versatile lithographic method and apparatus related to ATL and DTL for printing a larger variety of high-resolution patterns onto substrate surfaces to satisfy a range of fields of application and for ensuring a high-yield production process; and it is a second object of the invention to enable a more efficient utilization of light from the available sources to improve productivity and reduce costs in the manufacturing process.

BRIEF SUMMARY OF THE INVENTION

According to a first aspect of the present invention, a photolithographic method related to Talbot imaging is provided for printing a desired pattern of features that is periodic or quasi-periodic in at least one direction onto a substrate surface, which method includes:
a) providing a mask bearing a pattern of mask features that is periodic or quasi-periodic in at least one direction;
b) arranging the substrate parallel and in proximity to the mask;
c) providing an illumination source having a central wavelength and a spectral bandwidth;
d) forming from said source an illumination beam with an extended angular distribution of intensity; and
e) arranging the distance of the substrate from the mask and exposing the mask pattern to said beam so that each angular component of illumination exposes the substrate to substantially the entire range of lateral intensity distributions that occur between successive Talbot image planes for the individual illumination wavelengths;
wherein the angular distribution of the illumination beam is designed in conjunction with the pattern of features in the mask and the distance of the substrate from the mask.

According to the present invention, each point in the mask is most preferably illuminated with substantially the same angular distribution of intensity. For optimum lithographic results it is further desirable that the total intensity of the beam illuminating each point of the mask is substantially uniform.

For an exposure source having a relatively large spectral bandwidth, the distance of the substrate from the mask is preferably arranged before the exposure to a value depending on the bandwidth of the source so that each angular component of illumination forms a substantially stationary image at the substrate, as is taught by ATL for the case of collimated illumination (at a particular angle).

For an exposure source having a narrow spectral bandwidth, the distance of the substrate from the mask is preferably arranged to change during the exposure by at least a value corresponding substantially to the separation between successive Talbot image planes formed by each angular component of illumination at the central wavelength, as is taught by DTL for the case of collimated illumination (at a particular angle). Most preferably the gap should be changed by an integral multiple number of the separation between successive Talbot image planes.

Preferably, an illumination beam should be formed that delivers the required extended angular distribution of intensity in a simultaneous manner. However, alternatively, a beam may be formed that delivers the same extended angular distribution of intensity in a sequential manner.

Advantageously also, the method includes introducing a liquid between the mask and the substrate in order to enhance the resolution of the photolithographic system.

Further, the angular distribution of the illumination beam may comprise either a plurality of specific angles, or alternatively a continuous distribution of angles with constant or varying intensity across the distribution.

The invention is based on the principle that the images formed by both ATL and DTL techniques are stationary, that is, are insensitive to displacement in the direction of light propagation and have relatively large depth of focus. It further relies on the property that an adjustment to the angle of incidence of the illumination beam on the mask causes the image to displace laterally across the photoresist-coated substrate but otherwise remain substantially the same. The magnitude of the lateral displacement is proportional to the separation of the mask and substrate and to the change in angle of the beam. Thus, when a beam or beams with more than one angle of incidence is or are used to illuminate the mask, then the net image printed into the photoresist is an integration, or average, of the images produced at the various angles. The net image formed from a particular mask pattern using a particular angular distribution of illumination may therefore be calculated using a convolution operation in which the ATL or DTL image produced by light at normal incidence is convolved with the angular distribution. It should be mentioned that this representation and calculation assume that the light-fields in the images formed by the different angular components are incoherent with respect to each other, which is the case for many embodiments of the invention. If, however, a laser source is being employed to generate the angular distribution in a simultaneous manner, the light-fields of the different angular components may be mutually coherent, in which case the net image should be calculated by adding the amplitudes of the light-fields produced by the different angular components.

The method of the invention allows a high degree of control over the intensity distribution in the image of the periodic pattern of features printed onto the substrate surface, in particular with respect to i) the shape of features in the plane of the substrate surface, ii) the slope of the intensity profile at the edges of the features, iii) the intensity contrast of the features, iv) higher spatial frequency of the periodic features in the printed pattern compared to that of the periodic features in the mask (or, equivalently, smaller period of the printed pattern compared to that of the periodic pattern in the mask, v) array symmetry (i.e. square, rectangular, hexagonal, "honeycomb", etc) of the printed pattern compared to that in the mask, and vi) the depth of focus of the image. It therefore enables a considerably greater variety of periodic patterns to be printed in comparison with the prior art techniques of achromatic Talbot lithography and displacement Talbot lithography, whilst substantially retaining the major advantage of those techniques, that is, a large depth of focus for high-resolution periodic patterns. Consequently, the method of the invention allows a much greater range of applications than ATL and DTL.

According to a second aspect of the present invention, a lithographic apparatus related to Talbot imaging for printing a desired pattern of features that is periodic or quasi-periodic in at least one direction onto a substrate surface, which apparatus includes:
a) a mask bearing a pattern of mask features that is periodic in at least one direction;
b) a parallel arranging means for arranging the substrate parallel to the mask;

c) an illumination source having a central wavelength and a spectral bandwidth;

d) an optical system for forming from said source an illumination beam with an extended angular distribution of intensity;

e) a distance arranging means for arranging the distance of the substrate from the mask;

f) an exposure means for exposing the mask pattern to said illumination beam so that each angular component of illumination exposes the substrate to substantially the entire range of lateral intensity distributions that occur between successive Talbot image planes for the individual illumination wavelengths; and g) designing means for designing the extended angular distribution of the illumination beam is determined in conjunction with the pattern of features in the mask and the distance of the substrate from the mask.

Preferably, the illumination source is either a discharge lamp or a light emitting diode that generates light with a relatively large spectral bandwidth, or alternatively is a laser that generates light with very narrow spectral bandwidth.

Most advantageously, the optical system for generating a beam with an extended angular distribution includes a binary mask or a gray-scale mask.

Also most advantageously, the designing means of said lithographic apparatus includes a computer and simulation software for determining the image generated at the substrate surface by a certain extended angular distribution of intensity illuminating a particular pattern of mask features with a particular separation between the substrate and the mask.

BRIEF DESCRIPTION OF THE SEVERAL VIEWS OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE INVENTION

Figure 1:
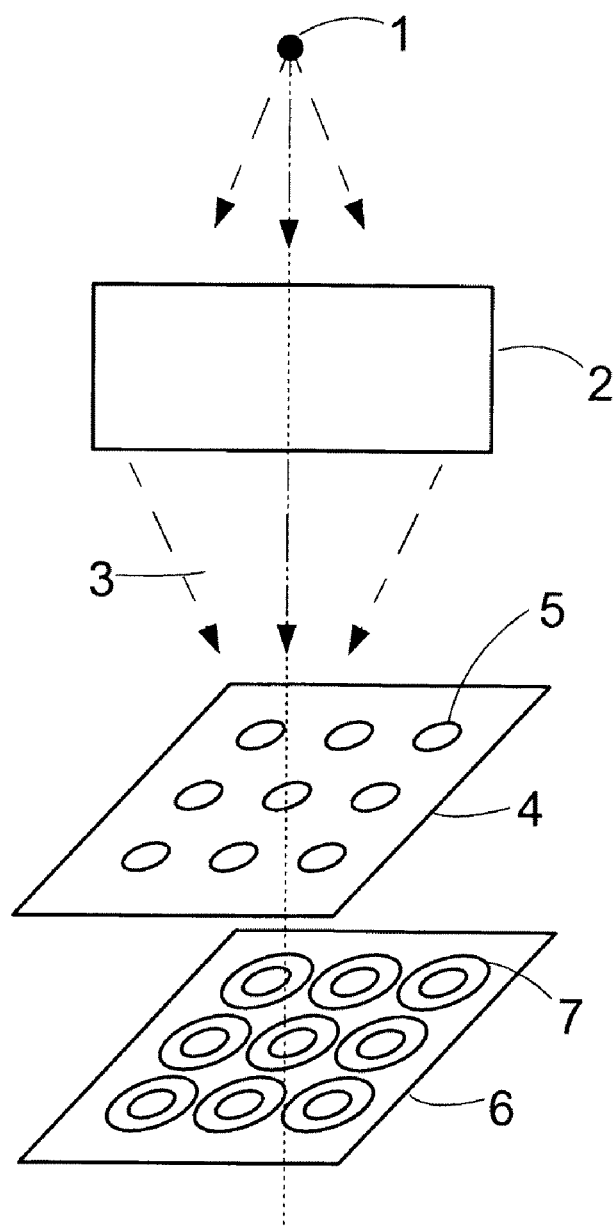
FIG. 1 shows the general concept of the present invention.

With reference first to FIG. 1, which illustrates the general concept of the present invention, an illumination source 1 generates light with a certain spectral bandwidth, which is incident on an optical system 2 that transforms the input beam into a light-field 3 for illuminating a mask 4. The light-field 3 illuminating the mask 4 is not collimated (i.e. its rays are not parallel) as employed in the prior art teachings of ATL and DTL, but rather illuminates each point in the mask with a particular angular distribution of rays. It should be understood that many different types and configurations of optical system 2 may be devised by experts in the field of optical engineering to achieve the above-described optical transformation, especially in view of the wide range of both exposure wavelengths and associated types of exposure source that may be employed with the present invention. The mask 4 contains a pattern of features 5 that is periodic in, in this example, two directions that diffracts the illumination beam 3. Below the mask 4 is located a substrate 6 having a photosensitive upper surface that is arranged substantially parallel with the mask 4. The exposure conditions are arranged so that during the course of the exposure the photosensitive layer on the substrate 6 is exposed to substantially the full range of lateral intensity distributions that are generated between successive Talbot planes generated by each angular component of illumination for the wavelengths concerned. If the illumination source 1 has a significant spectral bandwidth, this is preferably achieved by arranging the distance between the substrate 6 and mask 4 to be sufficiently large such that each angular component of illumination forms a stationary image at the photosensitive layer, as is taught by achromatic Talbot lithography for the case of collimated illumination (at a constant angle). If, on the other hand, the illumination is substantially monochromatic, it is preferably achieved by longitudinally displacing the substrate 6 relative to the mask 4 during the exposure by at least the separation between successive Talbot planes formed by each angular component of the illumination, as is taught by displacement Talbot lithography for the case of collimated illumination (at a constant angle). A combination of these two approaches might also be employed. These exposure conditions prints a periodic pattern 7 onto the substrate 6, whose intensity distribution may be calculated by convolving the intensity distribution generated at the substrate 6 by a collimated beam with the angular distribution of illumination 3 incident on the mask 4.

Two exemplary embodiments of the present invention are now described in more detail to more clearly explain the general inventive concept.

Figure 2:
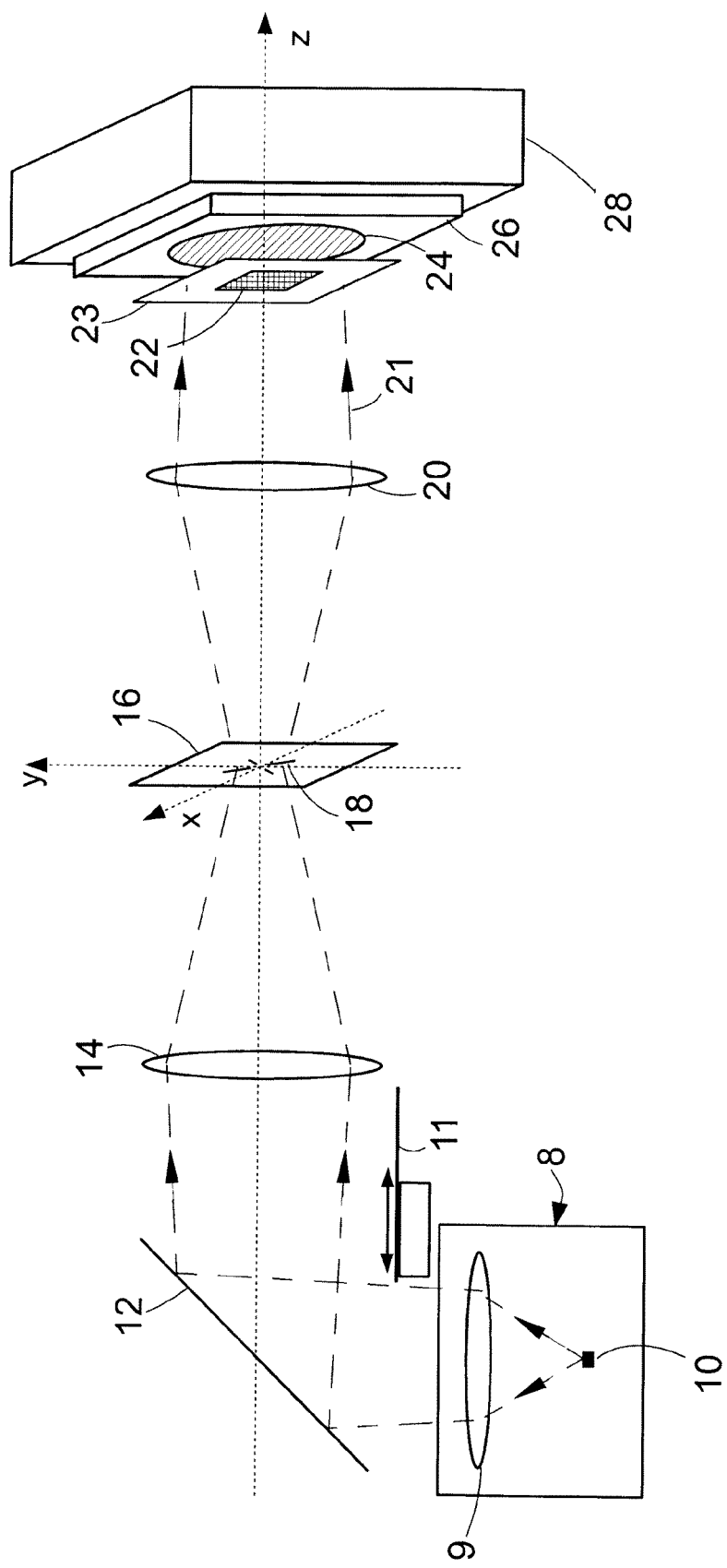
FIG. 2 shows a first embodiment of the present invention employing an illumination source with a relatively broad spectral bandwidth.

With reference to FIG. 2, which shows a first embodiment of the present invention, a commercially available 500 W mercury-xenon arc lamp unit 8 is employed as the light source. Its generates a broad spectrum of light including a component in the deep ultra-violet (DUV). The lamp unit 8 has a condenser lens 9 with a focal length ~50 mm that produces a 40 mm-diameter beam with good uniformity of intensity. Since the effective size of the arc 10 in the lamp unit 8 is ~2.5 mm×2.5 mm and the arc 10 is located in the focal plane of the condenser lens 9, the range of angles of the light rays in the output beam from the lamp unit 8 is ~±25 mR. After passing through an open electronically controlled shutter 11, the beam is incident on a dielectric mirror 12 that is highly reflective in the spectral range ~220-260 nm and highly transmissive outside of this range. The resulting beam of DUV light with a bandwidth ~40 nm that is reflected by this mirror 12 illuminates a lens 14 with focal length 100 mm which focuses the light to a spot of dimensions ~5 mm×5 mm on the surface of an angular distribution mask 16 located in the back focal plane of the lens 14. The angular distribution mask 16 comprises one or more open areas 18 in a layer of chrome on a fused silica substrate. The angular distribution mask 16 is also coplanar with the front focal plane of another lens 20 with focal lens 100 mm, and the light transmitted by the open areas 18 in the angular distribution mask 16 are projected by this lens 20 to form a beam 21 that illuminates a periodic pattern 22 in a pattern mask 23. Because of this optical arrangement and a well known optical principle, the angular distribution of the light in the beam illuminating the pattern mask 23 corresponds to the intensity distribution transmitted by the angular distribution mask 16 or, more specifically, each point at coordinates (x, y) in an open area of the angular distribution mask 16 generates a ray of light that illuminates the pattern mask 23 at an angle of incidence given by $$(\theta_x, \theta_y) = (\tan^{-1}(x/f), \tan^{-1}(y/f)), \quad \text{equ. (3)}$$

where $\theta_x$, and $\theta_y$ are the angular components of the beam in the xz and yz planes respectively and f is the focal length of lens 20.

Given that, in this particular embodiment, the size of the spot illuminating the angular distribution mask 16 is ~5 mm×5 mm and the focal length of lens 20 is 100 mm, the largest extent of the angular distribution that can be produced by the angular distribution mask 16 is ~±25 mR.

The lenses 9, 14, 20 are only schematically shown in FIG. 2. It should be understood by those expert in the field of optical design that each is not necessarily a simple bi-convex lens as indicated but may have another shape, or indeed be a combination of two or more lens elements, in order that the resulting geometric and chromatic aberrations are reduced to acceptable values. Further, the optical function of, for example, lens 20 may be alternatively performed, in other embodiments of the invention, by a reflective optical system comprising one or more mirrors. Thus, in more general terms, the angular distribution mask employed in embodiments of the present invention for forming the angular distribution of illumination (from either a source with large spectral bandwidth or a substantially monochromatic one) should be located in or near the front focal plane of an infinite conjugate imaging system.

In proximity with the pattern mask 23 is a silicon wafer 24 that has been spin-coated with a layer of a standard DUV-sensitive photoresist. The wafer 24 is held by a vacuum chuck 26 that is mounted to a stage system 28 (only shown schematically in the diagram). The stage system 28 incorporates micrometer actuators for adjusting, firstly, the angular tilt of the wafer 24 in both xz and yz planes and, secondly, the separation of the wafer 24 and pattern mask 23. Using the stage system 28 and also mechanical spacers of known thickness (not shown in the figure), the wafer 24 may be positioned substantially parallel to the mask 23 and at a particular distance from it.

Using this embodiment, in which the illumination from the exposure source 8 has a relatively broad bandwidth of ~40 nm, the exposure of the photoresist layer on the wafer 24 to the required range of lateral intensity distributions produced between successive Talbot images is preferably achieved by adjusting the distance of the wafer 24 from the mask 23 such that each angular component of illumination forms a stationary image at the surface of the wafer 24 according to ATL. The distance required depends on the period of the pattern 22 in the pattern mask 23 and the spectral bandwidth of the illumination source 8, as defined in equ. (2). Following adjustment of the position of the wafer 24 so that it is orientated substantially parallel to the mask 23 and separated from it by the required value, the lithographic exposure may proceed. Depending on the intensity of the exposure beam 21 illuminating the mask 23 and on the photoresist process, the duration of the exposure should be selected, using the electronically controlled shutter 11, such that following development of the photoresist the desired dimensions of printed features are obtained in the photoresist. The exposure time should be optimized together with the photoresist process using evaluation procedures for microstructures well-known to those skilled in the art. Examples of periodic structures that can be printed using this embodiment, by illuminating particular pattern masks 23 with a variety of angular distributions, are shown later in this section.

Figure 3:
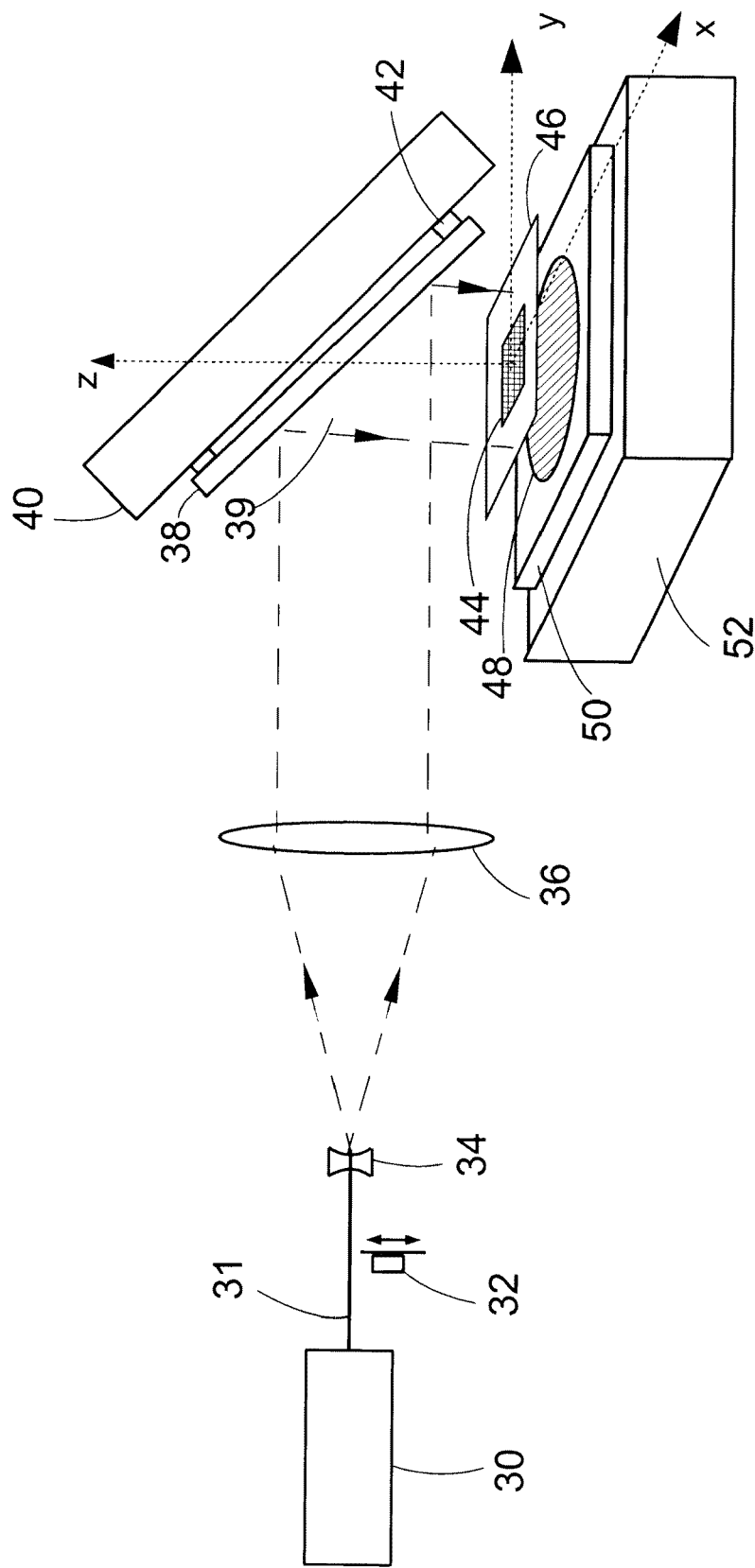
FIG. 3 shows a second embodiment of the present invention employing a substantially monochromatic illumination source.

In a second exemplary embodiment of the invention, with reference to FIG. 3, a pulsed frequency-quadrupled diode-pumped solid-state laser 30 emits a collimated beam of pulsed light 31 with wavelength 266 nm and an average output power 2 W. The cross-section of the beam 31 has a substantially Gaussian intensity profile with a $1/e^2$-diameter of ~5 mm. The beam 31 may be blocked by an electronically controlled shutter 32. When the shutter 32 is open the beam 31 is incident on a first, concave lens 34 of a beam expander, from which the light diverges and is then recollimated the second, convex lens 36 of the beam expander. The ratio of the focal lengths of the convex and concave lenses 34, 36 produces an expanded beam with a $1/e^2$-diameter of 50 mm. This beam is incident on a mirror 38 that reflects the beam so that illuminates a periodic pattern 44 in a pattern mask 46, the size of the pattern 44 being ~10 mm×10 mm. The mirror 38 is mounted to a mirror stage 40 that incorporates actuators 42 that allow the beam 39 reflected from the mirror to be angularly adjusted in the xz and yz planes with an angular resolution of 0.1 mR and over a range of ±100 mR. In proximity with the mask 46 is a photoresist coated wafer 48 held on a vacuum chuck 50 that is mounted to a stage system 52. The stage system 52 incorporates piezo-electric actuators that enable, firstly, the angular tilt of the wafer 48 to be adjusted with respect to the pattern mask 46 in both xz and yz planes and, secondly, the wafer 48 to be longitudinally displaced with respect to the mask 46 with a resolution of 10 nm.

Before exposure, the piezo-electric actuators of the stage system 52 are employed in conjunction with mechanical spacers of known thickness (not shown) to adjust the wafer 48 so that it is positioned substantially parallel to the mask 46 and at a particular distance from it. Following this the actuators 42 in the mirror stage 40 are adjusted so that, with the shutter 32 open, the mask 46 and wafer 48 are orientated substantially perpendicular to the illumination beam 39. The latter condition may be verified by observing the beam reflected from the mask 46 in relation to the incident beam 39, which is a standard alignment procedure well-known to optical engineers. This latter procedure calibrates the tilting mechanism of the stage 40 with respect to the illumination angle at the pattern mask 46.

Two exposure strategies may be used with this embodiment. If the desired angular distribution of the illumination beam comprises a plurality of discrete angles, then the preferred strategy is to tilt the mirror 38 so that the beam 39 sequentially illuminates the pattern mask 46 at each of the discrete angles. At each angle the shutter 32 is opened for the appropriate time so that the relative exposures correspond to the required distribution (in the simplest case the exposure required at each angle would be the same, and the shutter would be opened for the same time for each exposure), and during each exposure the separation of the wafer 48 and mask 46 is changed by a distance corresponding substantially to the separation of successive Talbot image planes for the wavelength concerned (as taught by DTL in the case of collimated illumination at a particular angle); thereby exposing the photoresist to substantially the entire range of lateral intensity distributions between successive Talbot image planes. The distance required depends on the period of the pattern in the pattern mask 46 and on the illumination wavelength, as defined in equ. (1). The exposure times for each angle should also be selected in relation to the intensity of the illumination beam 39 and the photoresist process so that the features printed into the photoresist have the desired dimensions.

If, on the other hand, the required angular distribution comprises a continuous distribution, then the preferred exposure strategy is rather to perform an angular scan of the mirror 38 in a continuous manner, for example, following a raster scan pattern. During the scanning the shutter 32 is opened and closed at appropriate times so that the time-integrated exposure corresponds to the required distribution. Simultaneously and continuously with this scanning, the separation between the wafer 48 and mask 46 is repeatedly varied by the distance corresponding to the separation of successive Talbot image planes, and preferably in an oscillating manner with an appropriately high frequency.

In more sophisticated exposure strategies using substantially the same embodiment, the intensity of the laser beam 31 may be additionally varied during the angular scan, and/or the speed of angular scan of the mirror 38 be varied during the angular scan, so that the time-integrated exposure corresponds to the required angular distribution.

Whereas this embodiment shows an angular displacement of the illumination beam 39 during the exposure, the same result may be achieved, in another embodiment, by an angular displacement of both the pattern mask and wafer during the exposure with respect to a static illumination beam: what is important is the relative angular motion between the illumination beam and the combination of pattern mask and wafer.

Examples of periodic structures that can be printed using the two above-described exemplary embodiments of the present invention, or indeed with many other possible embodiments, are shown below.

In order to demonstrate the superiority and versatility of the present invention with respect to the previously known techniques of ATL and DTL, the patterns printed using either of these prior art techniques from a typical periodic pattern in the pattern mask will first be shown.

Figure 5:
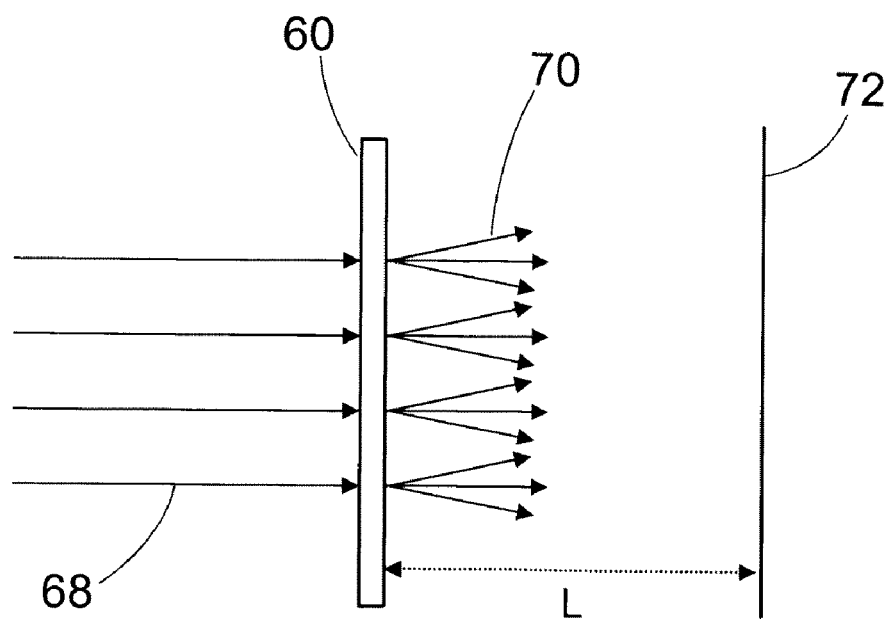
FIG. 5 shows the illumination of a mask using a collimated beam for generating a stationary image according to the prior art.
Figure 6A:
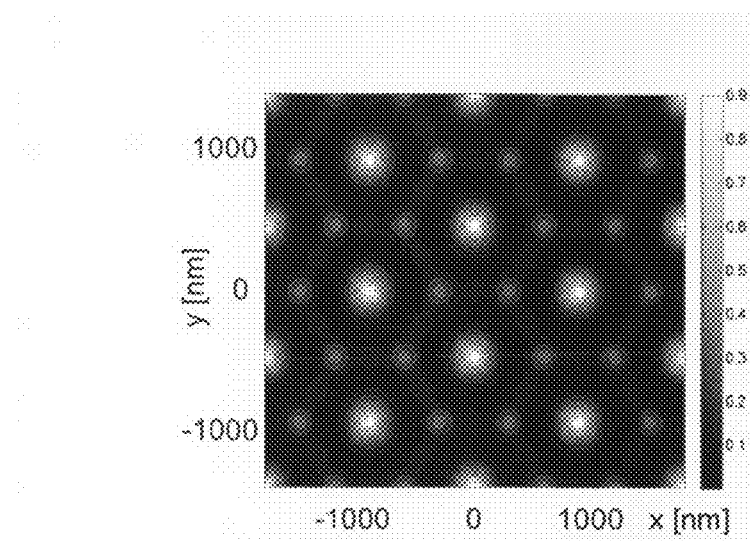
FIGS. 6a, 6b and 6c show respectively the stationary image generated by illuminating the periodic pattern of FIG. 4 with a collimated beam according to the prior art, the intensity profile along an axis of said image, and the resulting pattern printed into photoresist.
Figure 6B:
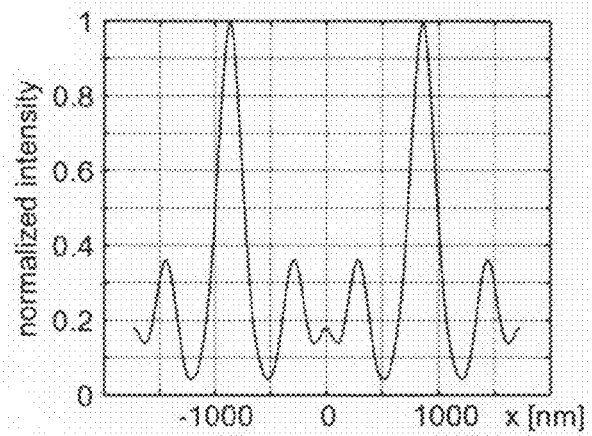
Figure 6C:
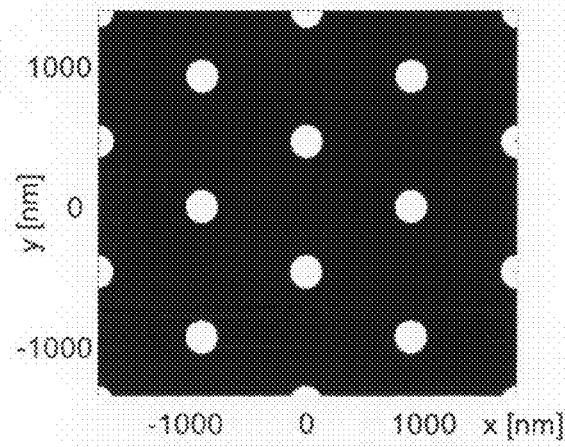

The periodic pattern in the mask (see FIG. 4 which shows a small section thereof) comprises holes 60 arranged on a hexagonal grid that are etched into a 40 nm-thick layer of chrome 62 on a fused silica substrate. The nearest neighbor distance between the holes 60 in the hexagonal array is 1 μm and the diameter of the holes 60 is 0.5 μm. The surface of the fused silica substrate within the holes 60 has additionally been etched to maximize the contrast of the image formed using the ATL or DTL technique according to the prior art. With reference to FIG. 5, the pattern in the mask 66 is illuminated, according to the prior art, at normal incidence with a collimated beam 68 with wavelength 240 nm and bandwidth ~40 nm. The illuminated periodic pattern of holes 60 in the mask 66 generates a light-field 70 that propagates away from the mask 66 and illuminates a substrate 72 located at a distance, L, from the mask 66. This distance, L, is selected to be 60 µm so that it is greater than the minimum value required for forming a stationary image using collimated illumination according to the ATL technique. The intensity distribution in the image plane, which constitutes an integration over the spectral range of the interference patterns formed by each incremental wavelength, is shown in FIG. 6a, and a cross-section of the intensity distribution in this image is shown in FIG. 6b. The topography of the resulting pattern printed by this intensity distribution into a layer of positive-tone photoresist is calculated using standard computational procedure for simulation of photolithographic exposure and development, and the result is shown in FIG. 6c. As can be seen, the pattern printed using an illumination scheme according to the prior art is also a hexagonal array of holes, with the same period as that of the periodic pattern in the mask and with a hole diameter significantly less than that in the mask.

Figure 4:
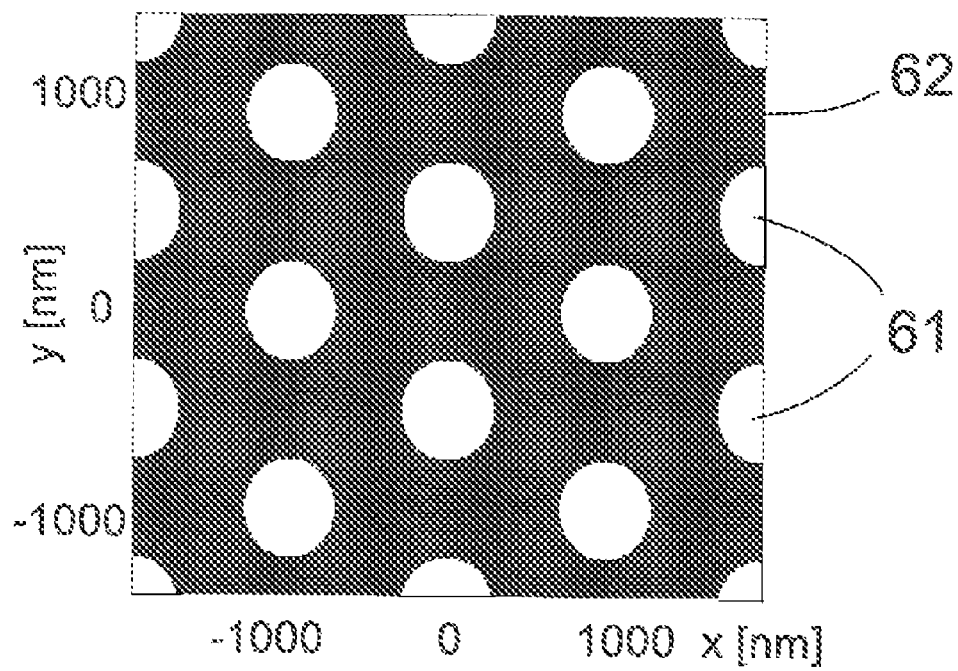
FIG. 4 shows a section of a periodic pattern of holes on a hexagonal grid in a mask.

The mask with the pattern of holes 60 illustrated in FIG. 4 is now illuminated with particular angular distributions that are generated, in these examples, by the two embodiments of the present invention illustrated in FIGS. 2 and 3.

In the case of the first embodiment different angular distribution masks 16 are fabricated following the design rule defined in equ. (3) in order to generate the desired angular distributions represented in each of FIGS. 7a, 8a, 9a, 10a, 11a, and 12a. Before illuminating with each of these angular distributions, an unexposed photoresist coated wafer 24 is loaded to the vacuum chuck 26 and positioned so that it is substantially parallel to the pattern mask 23 and separated from it by a distance of ~60 µm. This value is just larger than the minimum distance required by ATL for producing a stationary image from a pattern of period 1 µm using collimated light of spectral bandwidth ~40 nm.

In the case of the second embodiment, exposure sequences using the discrete and continuous schemes are devised to generate the angular distributions represented by FIGS. 7a, 8a, 9a, 10a, 11a and 12a. Similarly, before illuminating with each of the angular distributions, an unexposed photoresist coated wafer 48 is loaded to the chuck 50 and positioned so that it is substantially parallel to the pattern mask 46 and separated from it by a distance of ~60 µm. During the exposure of the wafer to each angular component, the wafer is longitudinally displaced with respect to the pattern mask by a distance of ~7.5 µm. This value corresponds to the separation between successive Talbot planes, as determined using equ. (1) for the values of pattern period and illumination wavelength concerned, so that each angular component exposes the wafer to the entire range of lateral intensity distributions between successive Talbot planes.

The resultant, or net, image that illuminates the photoresist using each of the angular distributions in the two above-described embodiments may be simulated by calculating the product of the respective angular distribution and the separation of the wafer and pattern mask, and convolving this distribution with the stationary image that would be formed at the wafer surface by collimated illumination if either ATL or DTL were being used.

The intensity variation along a central axis of the image can thus be readily determined; and the topography of the resulting structure printed into a layer of positive-tone photoresist may be estimated by simply thresh-holding the calculated intensity distribution.

Using such mathematical treatment it is possible to design the periodic mask pattern and the angular distribution required for printing the desired periodic pattern of features onto the substrate. For instance, the shape of the pattern features (in the plane of the photoresist) can be optimized to a particular geometry; the slope of the intensity profile at the edges of the features and the image contrast can be maximized in order that to ensure the dimensions of the features can be printed uniformly and reproducibly; a particular multiplication of spatial frequency from mask pattern to printed pattern (i.e. reduction in period) may be obtained; the array symmetry (i.e. square, rectangular, hexagonal, "honeycomb", etc) may be changed from that produced by ATL or DTL (i.e. a "honeycomb" array may be printed instead of a hexagonal pattern); and/or the depth of focus of the pattern may be optimized with respect to its other properties.

Figure 7A:
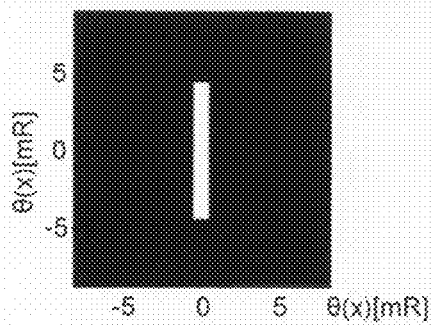
FIGS. 7a, 7b, 7c and 7d show respectively a rectangular angular distribution for illuminating, according to the present invention, a periodic pattern on a hexagonal grid, the intensity distribution in the resulting image, the intensity profile along an axis of said image, and the resulting pattern printed into photoresist.
Figure 7B:
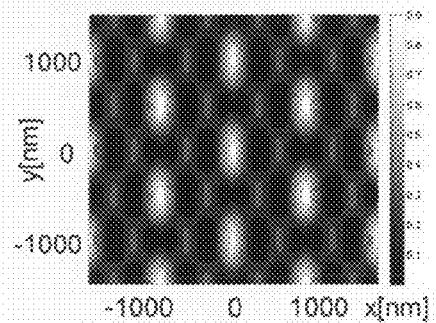
Figure 7C:
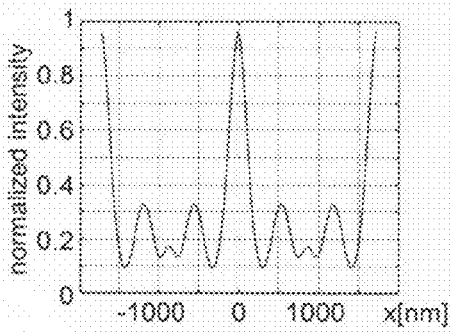
Figure 7D:
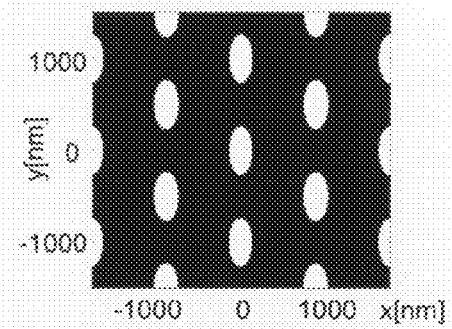

In the case of the rectangular angular distribution of FIG. 7a, the resultant image illuminating the photoresist is shown in FIG. 7b, the intensity variation along a central axis is shown in FIG. 7c, and the topography of the resulting pattern printed into photoresist is shown in FIG. 7d. This example demonstrates the capability of the present invention for printing an array of elongated features on a hexagonal grid.

Figure 8A:
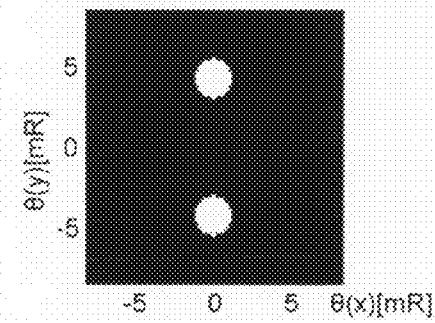
FIGS. 8a, 8b, 8c and 8d show an angular distribution comprising two circular zones for illuminating, according to the present invention, a periodic pattern on a hexagonal grid, the intensity distribution in the resulting image, the intensity profile along an axis of said image, and the resulting pattern printed into photoresist.
Figure 8B:
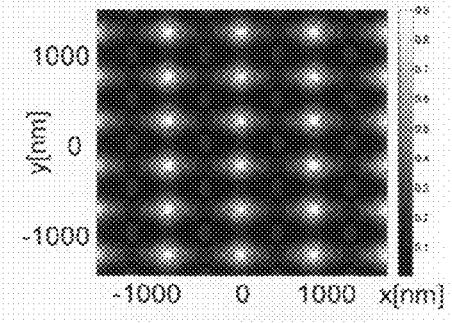
Figure 8C:
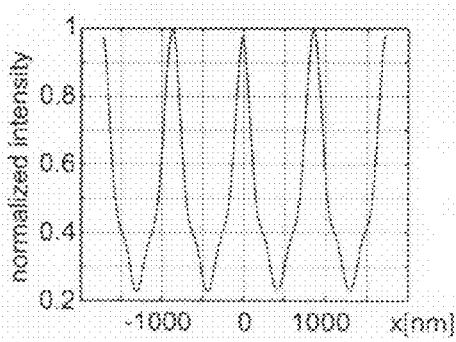
Figure 8D:
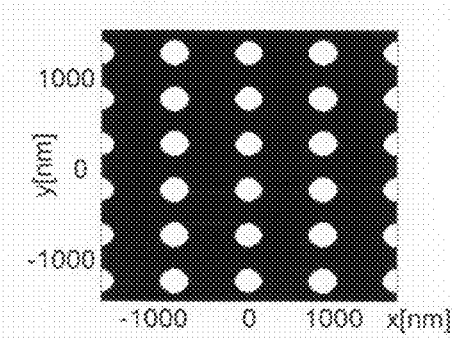

In the case of the angular distribution of FIG. 8a, which comprises two circular zones, the resultant image illuminating the photoresist is shown in FIG. 8b, the intensity variation along a central axis is shown in FIG. 8c, and the topography of the resulting pattern printed into photoresist is shown in FIG. 8d. This example demonstrates the capability of the present invention for printing a periodic pattern on a rectangular grid from a mask with periodic pattern on a hexagonal grid, and also for printing a periodic pattern with a period substantially smaller than that in the mask.

Figure 9A:
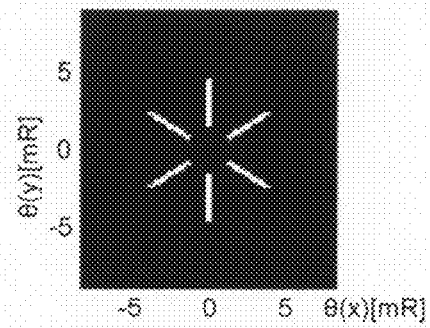
FIGS. 9a, 9b, 9c and 9d show respectively an angular distribution comprising six rectangular zones for illuminating, according to the present invention, a periodic pattern on a hexagonal grid, the intensity distribution in the resulting image, the intensity profile along an axis of said image, and the resulting pattern printed into photoresist.
Figure 9B:
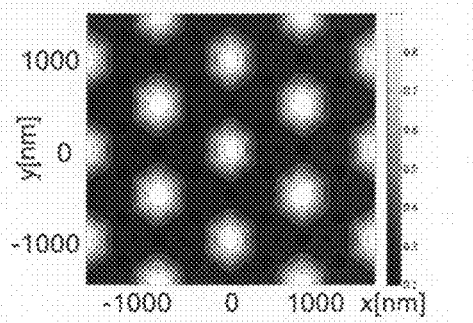
Figure 9C:
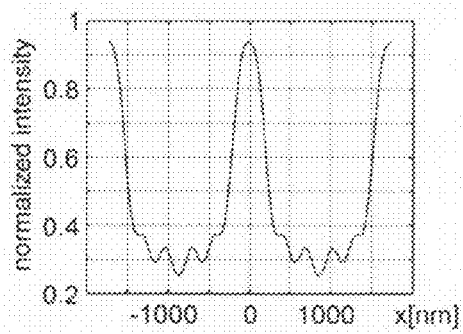
Figure 9D:
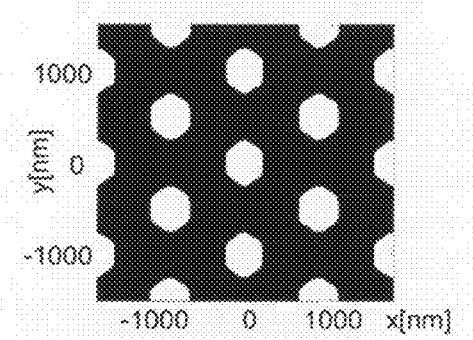

In the case of the angular distribution of FIG. 9a, which comprises 6 lines symmetrically arranged around a central point, the resultant image illuminating the photoresist is shown in FIG. 9b, the intensity variation along a central axis is shown in FIG. 9c, and the topography of the resulting pattern printed into photoresist is shown in FIG. 9d. This example demonstrates the capability of the present invention for printing periodic patterns whose features have shapes that are significantly different from those in the mask, and for printing hexagonal shapes.

Figure 10A:
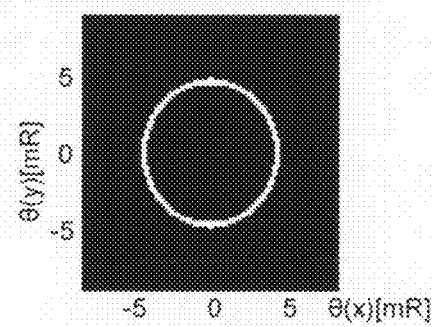
FIGS. 10a, 10b, 10c and 10d show respectively an annular angular distribution for illuminating, according to the present invention, a periodic pattern on a hexagonal grid, the intensity distribution in the resulting image, the intensity profile along an axis of said image, and the resulting pattern printed into photoresist.
Figure 10B:
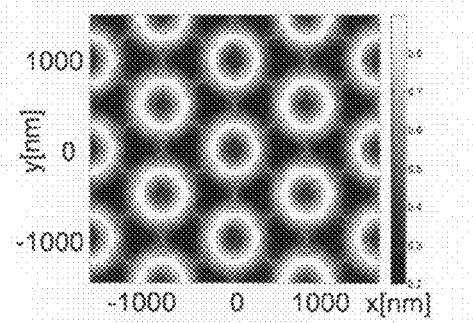
Figure 10C:
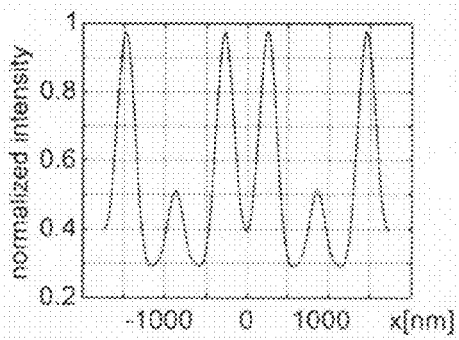
Figure 10D:
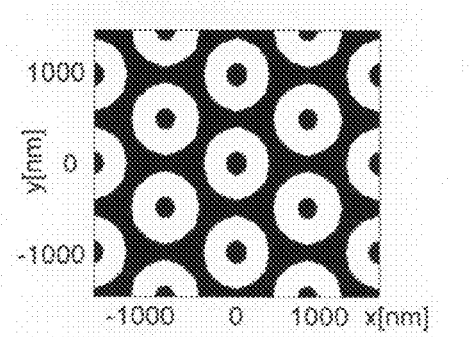

In the case of the annular angular distribution of FIG. 10a, the resultant image illuminating the photoresist is shown in FIG. 10b, the intensity variation along a central axis is shown in FIG. 10c, and the topography of the resulting pattern printed into photoresist is shown in FIG. 10d. The example again demonstrates the capability of the present invention for printing periodic patterns of features whose shapes are significantly different from those in the mask, and for printing ring shapes.

Figure 11A:
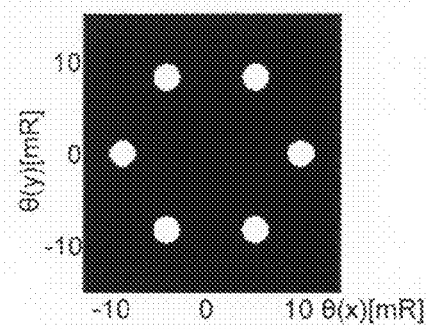
FIGS. 11a, 11b, 11c and 11d show respectively an angular distribution comprising six circular zones for illuminating, according to the present invention, a periodic pattern on a hexagonal grid, the intensity distribution in the resulting image, the intensity profile along an axis of said image, and the resulting pattern printed into photoresist.
Figure 11B:
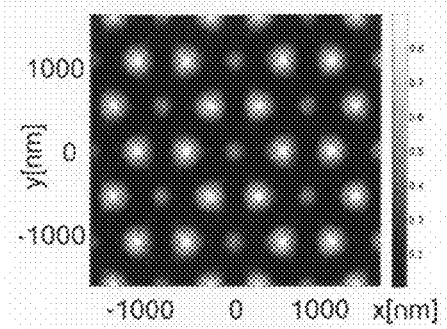
Figure 11C:
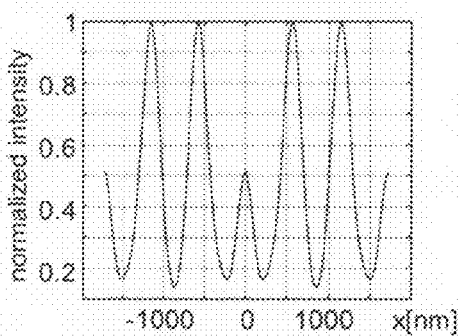
Figure 11D:
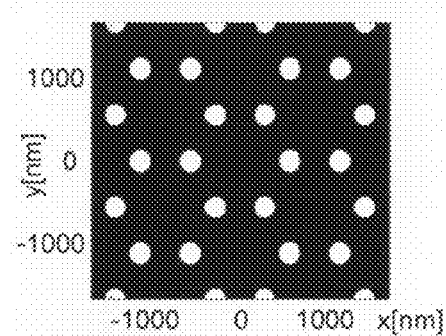

In the case of the angular distribution of FIG. 11a, which comprises six circular regions arranged in a hexagonal array, the resultant image illuminating the photoresist is shown in FIG. 11b, the intensity variation along a central axis is shown in FIG. 11c, and the topography of the resulting pattern printed into photoresist is shown in FIG. 11d. This examples demonstrate the capability of the present invention for printing a honeycomb array of holes, and for printing such holes with separations that are substantially smaller than their separation in the mask.

Figure 12A:
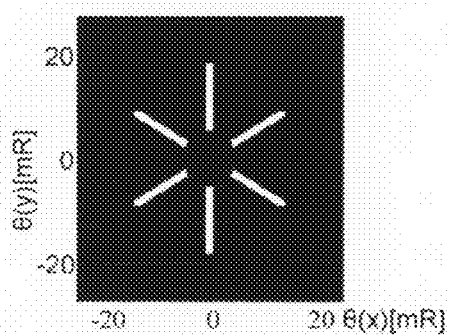
FIGS. 12a, 12b, 12c and 12d show respectively an angular distribution comprising six longer rectangular zones for illuminating, according to the present invention, a periodic pattern on a hexagonal grid, the intensity distribution in the resulting image, the intensity profile along an axis of said image, and the resulting pattern printed into photoresist.
Figure 12B:
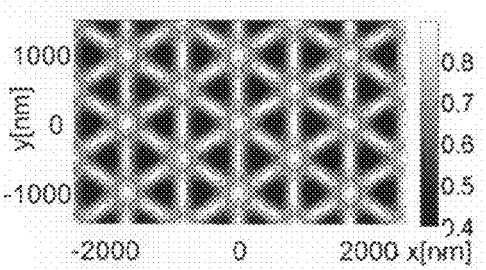
Figure 12C:
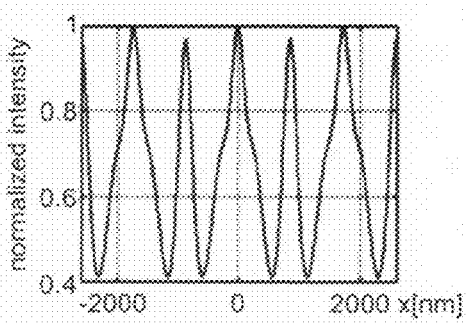
Figure 12D:
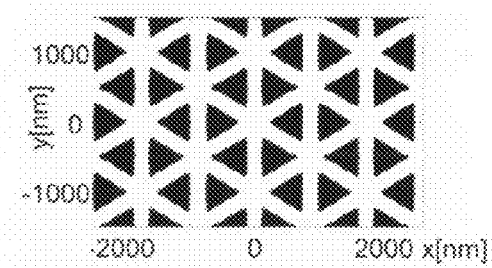

In the case of the angular distribution of FIG. 12a, which comprises 6 longer lines symmetrically arranged around a central point, the resultant image illuminating the photoresist is shown in FIG. 12b, the intensity variation along a central axis is shown in FIG. 12c, and the topography of the resulting pattern printed into photoresist is shown in FIG. 12d. This example demonstrates the capability of the present invention for printing a mesh, or grid, of high-resolution lines with an extended depth of focus.

Figure 13A:
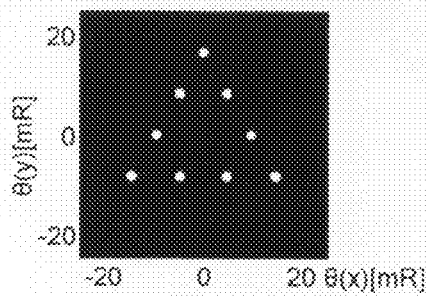
FIGS. 13a, 13b, 13c and 13d show respectively an angular distribution comprising nine circular zones for illuminating, according to the present invention, a periodic pattern on a hexagonal grid, the intensity distribution in the resulting image, the intensity profile along an axis of said image, and the resulting pattern printed into photoresist.
Figure 13B:
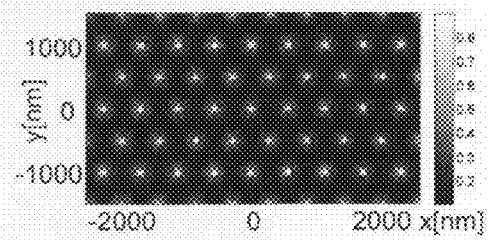
Figure 13C:
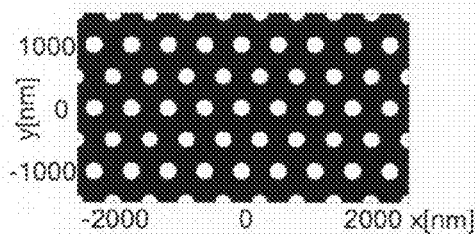
Figure 13D:
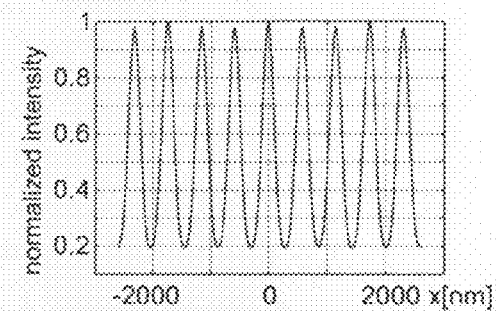

In the case of the angular distribution of FIG. 13a, which comprises a triangular array of nine circular holes, the resultant image illuminating the photoresist is shown in FIG. 13b, the intensity variation along a central axis is shown in FIG. 13c, and the topography of the resulting pattern printed into photoresist is shown in FIG. 13d. This example demonstrates the capability of the present invention for printing a pattern that has the same symmetry as that in mask but with a substantially higher spatial frequency, in this case by a factor of √3.

Figure 14A:
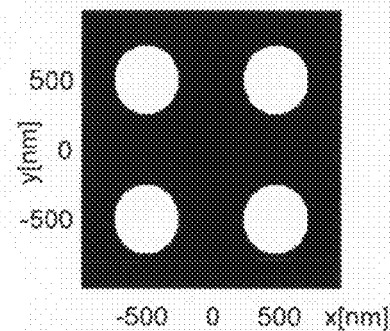
FIGS. 14a, 14b, 14c and 14d show respectively a section of a periodic pattern of holes on a square grid in a mask, the intensity distribution in the image generated by illuminating said pattern with a collimated beam according to the prior art, the intensity profile along an axis of said image, and the resulting pattern printed into photoresist.
Figure 14B:
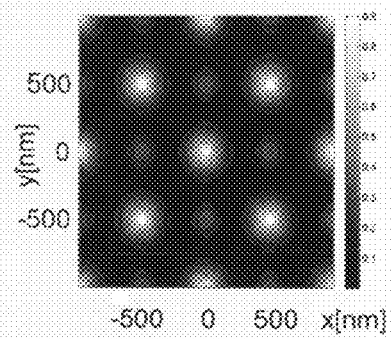
Figure 14C:
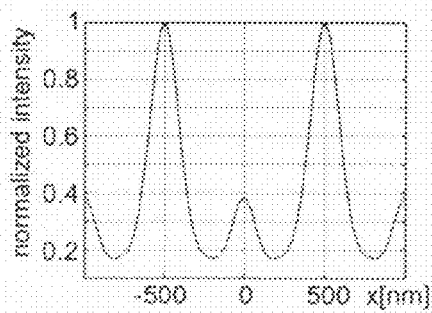
Figure 14D:
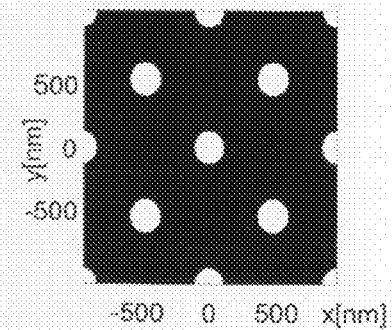

Another set of examples is now shown using instead a mask pattern comprising an array of holes on a square grid with 1 µm period, a section of which is shown in FIG. 14a. As previously, the holes have been etched into a 60 nm-thick layer of chrome on a fused silica substrate and the substrate within the holes has been further etched to maximize the contrast of the image obtained using the ATL or DTL techniques according to the prior art. The intensity distribution in the stationary image formed from this mask pattern using collimated illumination according to the prior art, as illustrated in FIG. 5, is shown in FIG. 14b, and the intensity variation along the central axis of the image is shown in FIG. 14c. The topography of the resulting pattern printed by this intensity distribution into a layer of positive-tone photoresist is shown in FIG. 14d. As can be seen, in this case the printed pattern also comprises holes on a square grid array, but the axes of the array have been rotated by 45 degrees with respect to those of the mask and the period of the array has been reduced by a factor of √2.

The results obtained using this pattern mask in the two above-described embodiments with various angular distributions of illumination are now presented to further illustrate the versatility and improved imaging properties possible with the present invention in comparison with the prior art.

Figure 15A:
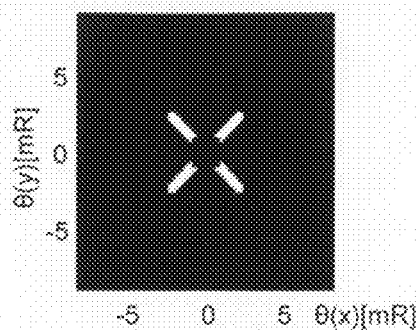
FIGS. 15a, 15b, 15c and 15d show respectively an angular distribution comprising four rectangular zones for illuminating, according to the present invention, a periodic pattern on a square grid, the intensity distribution in the resulting image, the intensity profile along an axis of said image, and the resulting pattern printed into photoresist.
Figure 15B:
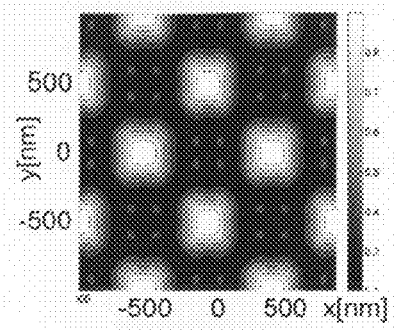
Figure 15C:
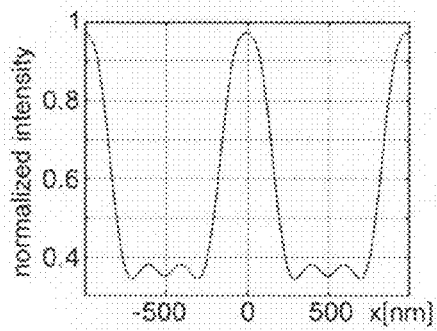
Figure 15D:
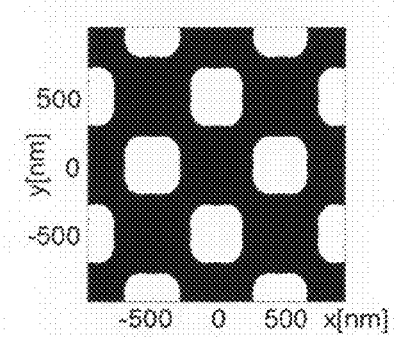

In the case of the angular distribution of FIG. 15a, comprising four arms of a 45°-rotated cross, the resultant image illuminating the photoresist is shown in FIG. 15b, the intensity variation along a central axis is shown in FIG. 15c, and the topography of the resulting pattern printed into photoresist is shown in FIG. 15d. This example demonstrates the capability of the present invention for printing an array of square shaped features.

Figure 16A:
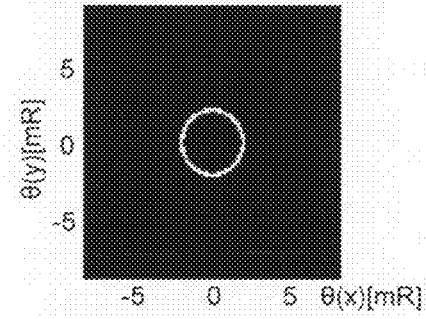
FIGS. 16a, 16b, 16c and 16d show respectively an annular angular distribution for illuminating, according to the present invention, a periodic pattern on a square grid, the intensity distribution in the resulting image, the intensity profile along an axis of said image, and the resulting pattern printed into photoresist.
Figure 16B:
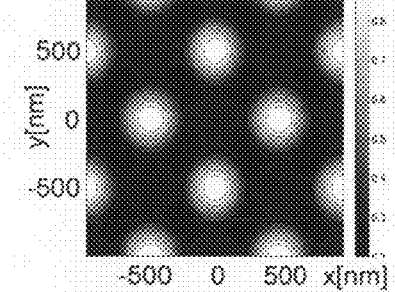
Figure 16C:
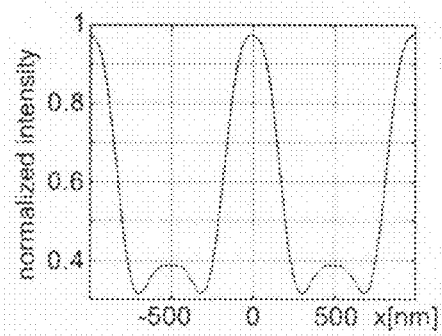
Figure 16D:
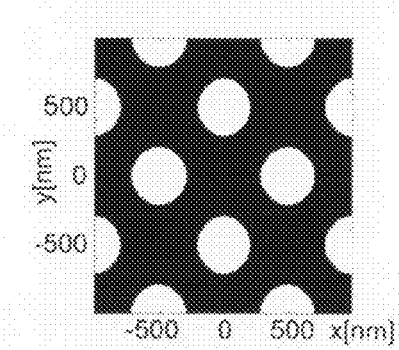

In the case of the annular angular distribution of FIG. 16a, the resultant image illuminating the photoresist is shown in FIG. 16b, the intensity variation along a central axis is shown in FIG. 16c, and the topography of the resulting pattern printed into photoresist is shown in FIG. 16d. The example demonstrates the capability of the present invention for printing arrays of holes whose diameter-to-period ratio is substantially larger than that achieved with the ATL or DTL techniques, and shows also that the various design parameters can be selected so that the gradient of the intensity profile at the edges of the features is high, as required for a high-yield production process.

Figure 17A:
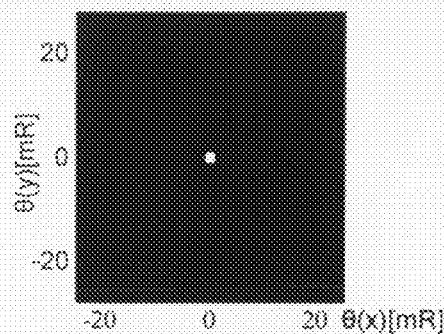
FIGS. 17a, 17b, 17c and 17d show respectively an angular distribution comprising a a single square zone for illuminating, according to the present invention, a periodic pattern on a square grid, the intensity distribution in the resulting image, the intensity profile along an axis of said image, and the resulting pattern printed into photoresist.
Figure 17B:
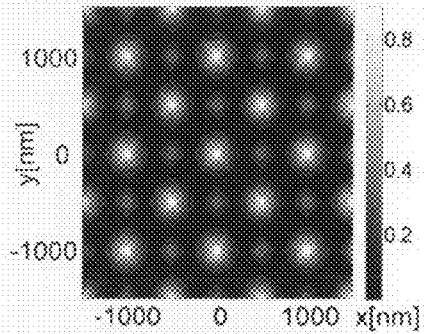
Figure 17C:
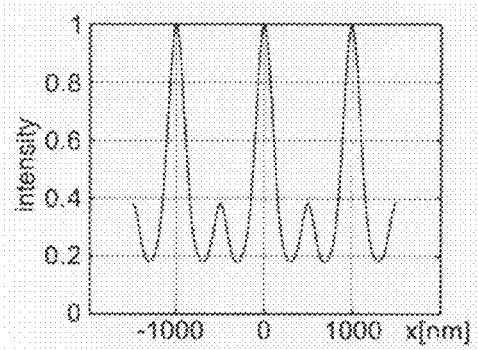
Figure 17D:
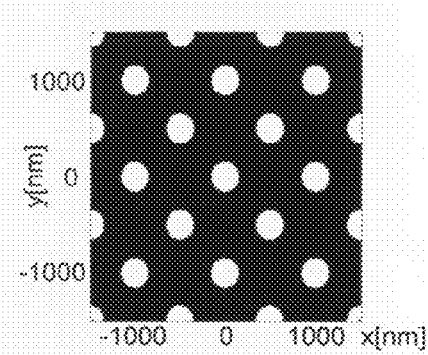

The next two sets of figures illustrate the improved utilization of illumination from a light source that is possible using the present invention. The angular distribution shown in FIG. 17a, comprising small square zone, essentially corresponds to a well collimated beam. FIGS. 17b, 17c and 17d show respectively the resulting light-field in the image plane, intensity profile along an axis of this image, and the pattern thereby printed into the photoresist. Using an arc source, however, only a very small fraction of the total light output can be used to produce such a well-collimated beam, that is, most of the light would be blocked by the chrome of the aperture mask concerned, which is a severe disadvantage for a production process. By, however, including additional holes in the aperture mask that correspond to the angular distribution of FIG. 18a, the intensity of the intensity of the light reaching the photoresist can be amplified. The holes in the angular distribution are arranged such that stationary images from each of the holes are aligned at the photoresist to produce substantially the same intensity distribution, as shown in FIG. 18b. The resultant intensity distribution along an axis is shown in FIG. 18c, demonstrating that the intensity of the image has been increased by a factor of 5, and lastly the pattern printed into photoresist by this angular distribution of illumination is shown in FIG. 18d.

For each of the above examples and generally using the present invention, the depth of focus of the imaged features is considerably larger than the corresponding value when printing the same pattern using a conventional lithographic technology (e.g. lens-based imaging system) operating at or near the same wavelength. The depth of focus of the patterns printed with the present invention is proportional to the period of the pattern and inversely proportional to the angular extent of the illumination.

Figure 18A:
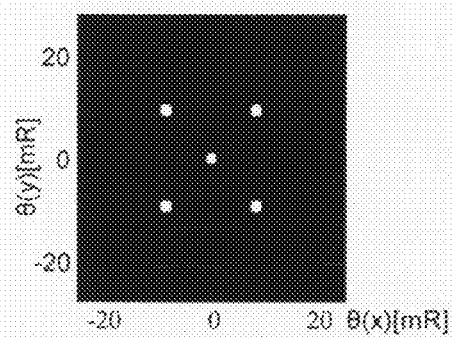
FIGS. 18a, 18b, 18c and 18d show respectively an angular distribution comprising five square zones for illuminating, according to the present invention, a periodic pattern on a square grid, the intensity distribution in the resulting image, the intensity profile along an axis of said image, and the resulting pattern printed into photoresist.
Figure 18B:
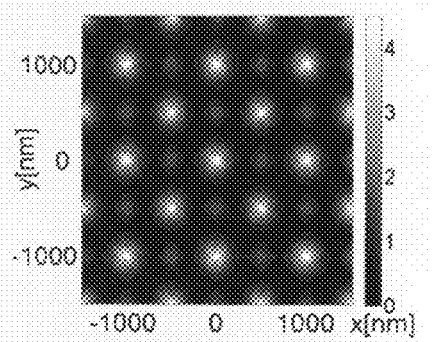
Figure 18C:
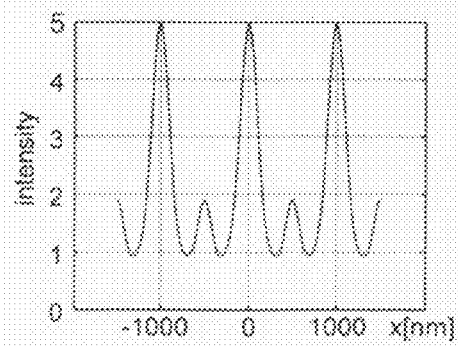
Figure 18D:
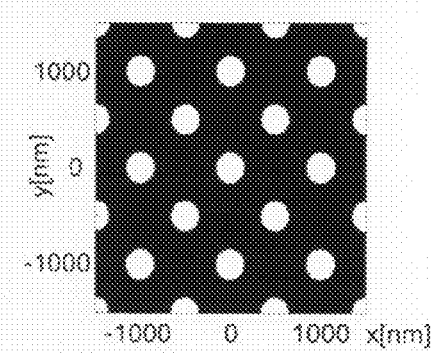
Figure 19A:
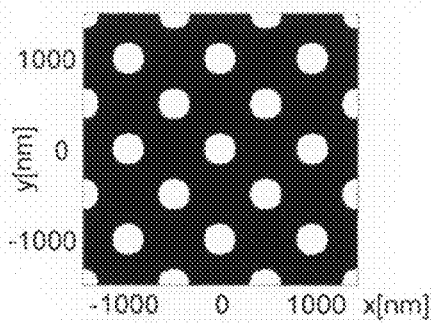
FIGS. 19a, 19b, 19c and 19d show respectively the intensity distribution in an image with a positive defocus, the intensity profile across this image, the intensity distribution in the image with a negative defocus, and the intensity profile across that image, when illuminating, according to the present invention, a periodic pattern on a square grid with an angular distribution comprising five square zones.
Figure 19B:
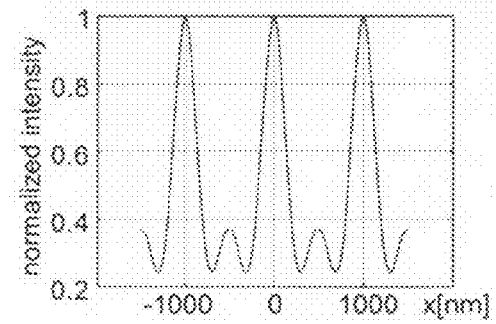
Figure 19C:
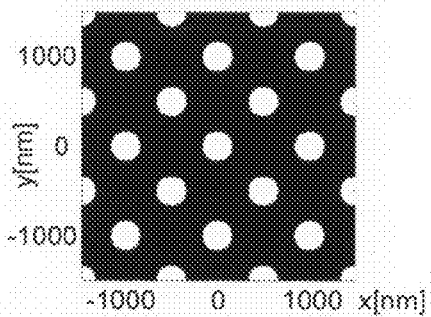
Figure 19D:
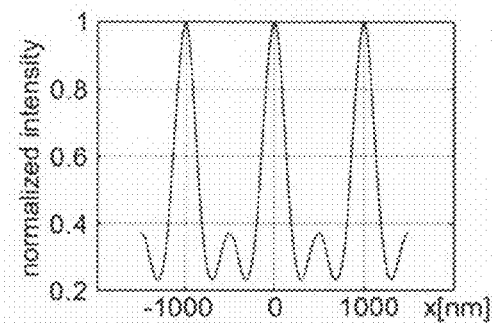
Figure 20:
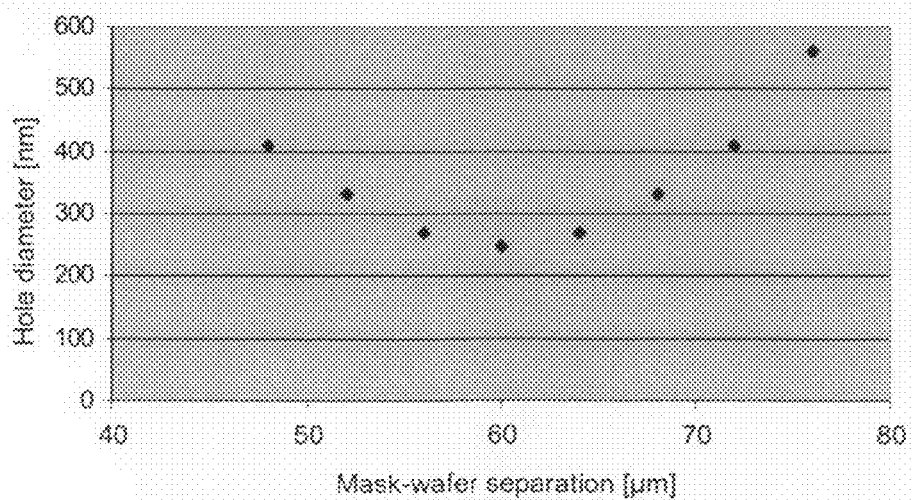
FIG. 20 shows the dependence of the diameter of the holes printed into photoresist on the separation between the substrate and mask when illuminating, using the present invention, a periodic pattern on a square grid with an angular distribution comprising five square zones.

To demonstrate the large depth of focus possible with this technique, the 0.25 µm-resolution image generated by the angular distribution of FIG. 18a and the resulting pattern printed into photoresist are calculated at different values of defocus. For defocus values of −8 µm and +8 µm the intensity profiles along the axis of the images are shown respectively in FIGS. 19a and 19c, and the patterns printed at these defocus distances into the photoresist are shown respectively in FIGS. 19b and 19d. The dependence of the diameters of the holes printed in photoresist on the defocus value is shown in FIG. 20, thus demonstrating the large depth of focus that can be obtained for high-resolution patterns using the present invention.

Since, as mentioned, the depth of focus depends on the angular extent of the illumination, even larger values of depth of focus may be obtained with substantially the same image quality by reducing the angular extent of the illumination and displacing the focal plane of the image further from the pattern mask.

A large depth of focus enables better printing uniformity and reproducibility, and a wider range of applications In fact, for all the above examples and generally using the present invention, the depth of focus of the imaged features is, in common with the ATL and DTL techniques, considerably larger than when printing the respective patterns using conventional lithographic technologies (e.g. lens- or mirror-based imaging systems) operating at or near the same wavelength.

In all the above examples, the angular distributions of intensity employed are binary, that is, the relative intensity at a particular angle is either 0 or 1. The chrome-on-quartz angular distribution mask 16 employed in the first exemplary embodiment is therefore suitable for producing such a distribution because its transmission is also binary: 0 where there is chrome and 1 in the open spaces (neglecting small reflection losses). This, however, is not a necessary condition or restriction of the present invention. In the above and other embodiments, the intensity at each angle may alternatively be quantized to multiple discrete levels or, more generally still, to vary in a substantially analogue way. Such angular distributions may be produced using, for example, gray-scale masks as are manufactured by Canyon Materials Inc., in which the transmission of the mask features can be varied in a gradual way between 0 and 1.

The smallest feature size that may be printed using the present invention may be significantly reduced by introducing a thin layer of a suitable liquid in the gap between the mask and substrate. For example, in the apparatus shown in FIG. 2, by including water between the mask 23 and wafer 24, the limit of imaging resolution of the system may be enhanced by nearly 40%. This arises because of the higher refractive index of water compared to air. It also enlarges the depth of focus of the printed pattern. Thus, in other embodiments of the invention, a suitable fluid, like water, which transmits the exposure wavelength with low absorption and is compatible with the photosensitive layer on the substrate surface, may be included between the mask and substrate for this purpose.

In another embodiment of the invention, angular distribution masks as described in the first embodiment for generating the required angular distribution of illumination may instead be employed with a laser source, and the exposures performed with a varying separation between the wafer and pattern mask.

In another embodiment of the invention, the optical scheme using an angular displacement of a mirror as described in the first embodiment for generating the required angular distribution of illumination may instead be employed with a light source with a relatively broad spectral bandwidth, and the exposures performed using a static separation between the wafer and pattern mask.

In other embodiments of the invention, the output wavelengths of the illumination source can be anywhere in a very broad range, for example, in the range 100-1000 nm.

The invention claimed is:

1. A lithographic method related to Talbot imaging for printing a desired pattern of features that is periodic or quasi-periodic in at least one direction onto a substrate surface, which method includes:
    a) providing a mask bearing a pattern of mask features that is periodic or quasi-periodic in at least one direction;
    b) arranging the substrate parallel and in proximity to the mask so that the substrate is at a distance from the mask;
    c) providing an illumination source and generating light having a central wavelength and a spectral bandwidth of wavelengths;
    d) forming from said light a beam for illuminating each point of the mask pattern with an extended angular distribution of intensity comprised of angular components so that each component for the individual illumination wavelengths forms Talbot images of the mask pattern, between whose successive planes is a range of lateral intensity distributions; and
    e) arranging the distance of the substrate from the mask and illuminating each point of the mask pattern with the angular distribution such that each angular component exposes the substrate to substantially the entire range of lateral intensity distributions, whereby the angular distribution forms a net image at the substrate that prints the desired pattern;
    wherein the extended angular distribution of the illumination beam is designed in conjunction with the pattern of features in the mask and the distance of the substrate from the mask by arranging that a convolution of, first a product of the angular distribution and the distance of the substrate from the mask with, secondly, a stationary image that would be formed from the mask pattern using one of achromatic Talbot lithography and displacement Talbot lithography corresponds to the net image.

2. A lithographic method according to claim 1, wherein the distance of the substrate from the mask is arranged before the exposure to a value depending on the bandwidth of the source so that each angular component of illumination forms a substantially stationary image at the substrate.

3. A lithographic method according to claim 1, wherein the distance of the substrate from the mask is arranged to change during the exposure by at least a value corresponding substantially to the separation between successive Talbot image planes formed by each angular component of illumination at the central wavelength.

4. A lithographic method according to claim 1, wherein the illumination beam is formed that delivers the angular components of the extended angular distribution of intensity in a simultaneous manner.

5. A lithographic method according to claim 1, wherein the illumination beam is formed that delivers the angular components of the extended angular distribution of intensity in a sequential manner.

6. A lithographic method according to claim 1, wherein the extended angular distribution comprises a plurality of discrete angles.

7. A lithographic method according to claim 1, wherein the extended angular distribution has components either in a single plane or in orthogonal planes.

8. A lithographic method according to claim 1, further including forming from said light a second illumination beam with a second extended angular distribution, replacing the substrate with a second substrate, arranging the distance of the second substrate from the mask, and exposing the mask pattern to said second illumination beam, whereby a second desired pattern of features that is periodic or quasi-periodic in at least one direction is printed onto the surface of the second substrate.

9. A lithographic method according to claim 1, wherein the net image is composed of imaged features that have a contrast and an intensity profile with a slope at edges of image features, and at least one of the slope and the contrast of the imaged features is or are optimized.

10. A lithographic method according to claim 1, wherein the design of the angular distribution of illumination includes computer simulation of the image of the desired pattern of features at the substrate surface generated by illuminating the pattern of mask features with the extended angular distribution of intensity.

11. A lithographic method according to claim 1, additionally including providing a layer of liquid between the mask and the substrate.

12. A lithographic method according to claim 1, wherein the extended angular distribution comprises a continuous distribution.

13. A lithographic apparatus related to Talbot imaging for printing a desired pattern of features that is periodic in at least one direction onto substrate surface, which apparatus includes:
    a) a mask bearing a pattern of mask features that is periodic in at least one direction;
    b) a parallel arranging means for arranging the substrate parallel to the mask;
    c) an illumination source for generating light having a central wavelength and a spectral bandwidth of wavelengths;
    d) an optical system for generating from said light a beam for illuminating each point of the mask pattern with an extended angular distribution of intensity comprised of angular components so that each component for the individual illumination wavelengths forms Talbot images of the mask pattern, between whose successive planes is a range of lateral intensity distributions;

e) a gap arranging means for arranging of the substrate at the distance from the mask;
f) an illumination means for exposing each point of the mask pattern to said angular distribution so that each angular component of illumination exposes the substrate to substantially the entire range of lateral intensity distributions, whereby the angular distribution forms a net image at the substrate that prints the desired pattern; and
g) means for designing the extended angular distribution of the illumination beam required in conjunction with the pattern of features in the mask and the distance of the substrate from the mask by arranging that a convolution of, first, a product of the angular distribution and the distance of the substrate from the mask with, secondly, a stationary image that would be formed from the mask pattern using instead one of achromatic Talbot lithography and displacement Talbot lithography corresponds to the net image.

14. A lithographic apparatus according to claim 13, wherein the illumination source is a discharge lamp or a light emitting diode that generates light with a relatively large spectral bandwidth.

15. A lithographic apparatus according to claim 13, wherein the illumination source is a laser that generates light with relatively narrow spectral bandwidth.

16. A lithographic apparatus according to claim 13, wherein the optical system for generating a beam with an extended angular distribution includes a binary mask or a gray-scale mask.

17. A lithographic apparatus according to claim 13, wherein the designing means includes a computer and simulation software for determining the image generated at the substrate surface by the extended angular distribution of intensity illuminating the pattern of mask features.

* * * * *